US008937318B2

(12) United States Patent
Wada et al.

(10) Patent No.: US 8,937,318 B2
(45) Date of Patent: Jan. 20, 2015

(54) LIGHT-EMITTING DEVICE HAVING TAPERED PORTIONS OF DIFFERENT LENGTHS

(71) Applicant: Toyoda Gosei Co., Ltd., Kryosu-shi, Aichi-ken (JP)

(72) Inventors: Satoshi Wada, Kiyosu (JP); Koichi Goshonoo, Kiyosu (JP); Yoshiki Saito, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/865,890

(22) Filed: Apr. 18, 2013

(65) Prior Publication Data
US 2013/0277681 A1     Oct. 24, 2013

(30) Foreign Application Priority Data

Apr. 24, 2012 (JP) ................................. 2012-099046

(51) Int. Cl.
*H01L 33/00* (2010.01)
*H01L 33/20* (2010.01)
*H01L 33/56* (2010.01)

(52) U.S. Cl.
CPC ................ *H01L 33/20* (2013.01); *H01L 33/56* (2013.01)
USPC .......... 257/76; 257/96; 257/99; 257/E33.056; 438/27; 438/28

(58) Field of Classification Search
CPC ...................................................... H01L 33/00
USPC ............. 257/76, E33.056, 98, 99; 438/27, 28
See application file for complete search history.

(56) References Cited

U.S. PATENT DOCUMENTS

| | | | |
|---|---|---|---|
| 7,361,938 B2 | 4/2008 | Mueller et al. | |
| 2003/0122478 A1 | 7/2003 | Suehiro et al. | |
| 2005/0269582 A1 | 12/2005 | Mueller et al. | |
| 2008/0138919 A1 | 6/2008 | Mueller et al. | |
| 2009/0146170 A1* | 6/2009 | Zhong et al. | 257/98 |
| 2010/0078670 A1* | 4/2010 | Kim et al. | 257/98 |
| 2010/0148193 A1* | 6/2010 | Duong et al. | 257/88 |
| 2011/0201184 A1* | 8/2011 | Motoki et al. | 438/492 |

FOREIGN PATENT DOCUMENTS

| | | |
|---|---|---|
| JP | 2002-353497 A | 12/2002 |
| JP | 2006-5367 A | 1/2006 |

* cited by examiner

*Primary Examiner* — Matthew Gordon
(74) *Attorney, Agent, or Firm* — McGinn IP Law Group, PLLC

(57) ABSTRACT

A light-emitting device includes a case including a first substrate and a sidewall on the first substrate, a light-emitting element that is mounted on the first substrate in a region surrounded by the sidewall and includes a second substrate and a crystal layer, the light-emitting element being formed rectangular in a plane viewed in a direction perpendicular to the first substrate, and a low-refractive-index layer that is located between the light-emitting element and the sidewall and has a smaller refractive index than the second substrate. A side surface along a longitudinal direction of the second substrate is provided with a tapered portion on a side of the first substrate.

10 Claims, 6 Drawing Sheets

LIGHT-EMITTING DEVICE HAVING TAPERED PORTIONS OF DIFFERENT LENGTHS

The present application is based on Japanese patent application No. 2012-099046 filed on Apr. 24, 2012, the entire contents of which are incorporated herein by reference.

BACKGROUND OF THE INVENTION

1. Field of the Invention

The invention relates to a light-emitting device.

2. Related Art

A conventional light-emitting device is known which has a light-emitting element mounted on a submount, a ceramic layer formed on the light-emitting element to extract light and a layer formed on a side of the light-emitting element to connect the ceramic layer to the submount (see, e.g., JP-A-2006-005367).

Meanwhile, a face-down type light-emitting element in which a reflective groove for increasing light reflection efficiency is provided on a light-emitting layer on a bottom side is known as a conventional light-emitting element (see, e.g., JP-A-2002-353497).

SUMMARY OF THE INVENTION

It is an object of the invention to provide a light-emitting device that can ensure high light extraction efficiency even if downsized or thinned.

(1) According to one embodiment of the invention, a light-emitting device comprises:
- a case comprising a first substrate and a sidewall on the first substrate;
- a light-emitting element that is mounted on the first substrate in a region surrounded by the sidewall and comprises a second substrate and a crystal layer, the light-emitting element being formed rectangular in a plane viewed in a direction perpendicular to the first substrate; and
- a low-refractive-index layer that is located between the light-emitting element and the sidewall and has a smaller refractive index than the second substrate, wherein a side surface along a longitudinal direction of the second substrate is provided with a tapered portion on a side of the first substrate.

In the above embodiment (1) of the invention, the following modifications and changes can be made.

(i) A non-tapered portion on the side surface along the longitudinal direction of the second substrate has a higher smoothness than a side surface along the lateral direction of the second substrate.

(ii) The second substrate comprises a GaN substrate having a c-plane as a principal surface, wherein the non-tapered portion on the side surface along the longitudinal direction of the second substrate comprises an in-plane, and wherein the side surface along the lateral direction of the second substrate comprises an a-plane.

(iii) The low-refractive-index layer comprises a layer of air or vacuum.

(iv) The is sealed by a glass layer formed on the sidewall.

(v) The light-emitting element comprises a plurality of light-emitting elements, and wherein the low-refractive-index layer is located between each of the plurality of light-emitting elements and the sidewall and between the plurality of light-emitting elements.

POINTS OF THE INVENTION

According to one embodiment of the invention, a light-emitting device is constructed such that a side surface along or parallel to the longitudinal direction of an element mounting substrate is provided with a tapered portion on the side of the device mounting substrate. Also, a side surface along or parallel to the lateral direction of the element mounting substrate may be provided with a tapered portion on the side of the device mounting substrate. Thereby, light emitted from a light-emitting layer of the element is likely to be reflected upward since an angle defined between the light traveling in the element mounting substrate toward the outside and a surface of the tapered portion of the element mounting substrate decreases due to having the tapered portion so as to improve the light extraction efficiency of the light-emitting device.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Figure 1A:
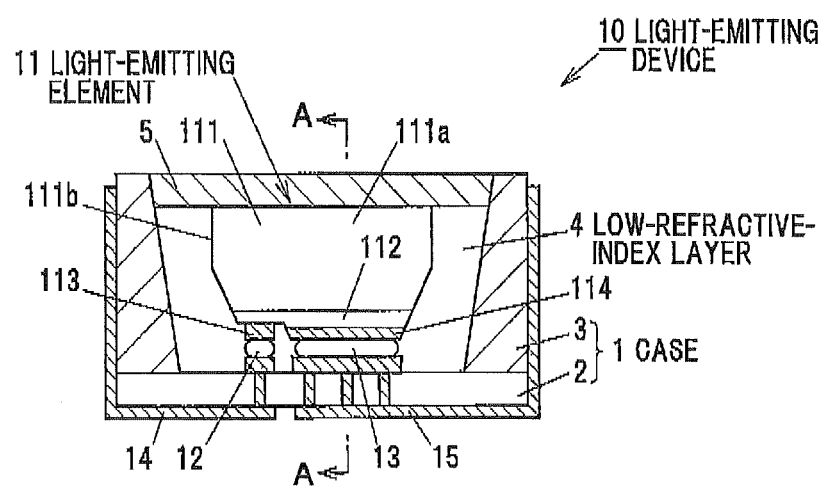
FIG. 1A is a vertical cross-sectional view showing a light-emitting device in a first embodiment and FIG. 1B is a vertical cross-sectional view of the light-emitting device taken on line A-A of FIG. 1A.
Figure 1B:
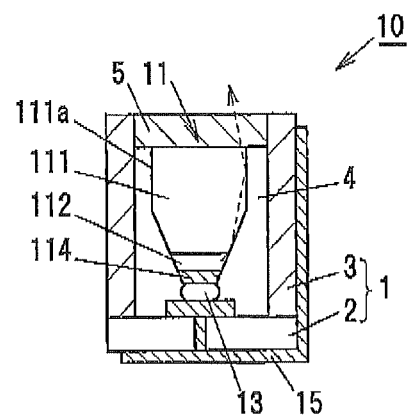

FIG. 1A is a vertical cross-sectional view showing a light-emitting device in the first embodiment. FIG. 1B is a vertical cross-sectional view of the light-emitting device taken on line A-A of FIG. 1A.

A light-emitting device 10 has a case 1 composed of a substrate 2 and a sidewall 3, a light-emitting element 11 mounted on the substrate 2 in a region surrounded by the sidewall 3, a low-refractive-index layer 4 located between the light-emitting element 11 and the sidewall 3 and a phosphor layer 5 on the light-emitting element 11.

The substrate 2 is formed of, e.g., alumina, AlN or a metal material, etc. The sidewall 3 is formed of, e.g., a resin or alumina, etc.

The light-emitting element 11 is a face-down LED chip being rectangular in plan as viewed in a direction perpendicular to the substrate 2 and has a substrate 111 and a crystal layer 112. The substrate 111 is, e.g., a GaN substrate. The crystal layer 112 is a GaN-based ($Al_{1-X-Y}In_XGa_YN$, $0 \leq X \leq 1$, $0 \leq Y \leq 1$, $0 \leq X+Y \leq 1$) semiconductor layer formed on the substrate 111 by epitaxial crystal growth and has a light-emitting layer sandwiched between an n-type semiconductor layer and a p-type semiconductor layer. By forming the substrate 111 and the crystal layer 112 from the same base material, it is possible to suppress light reflection at an interface between the substrate 111 and the crystal layer 112.

A side surface 111a along (or parallel to) the longitudinal direction of the substrate 111 is provided with a tapered portion on the side of the substrate 2. Also a side surface 111b along (or parallel to) the lateral direction of the substrate 111 may be provided with a tapered portion on the side of substrate 2. Thereby, light emitted from a light-emitting layer of the element 11 is likely to be reflected upward since an angle defined between the light traveling in the substrate 111 toward the outside and a surface of the tapered portion of the substrate 111 decreases so as to improve the light extraction efficiency of the light-emitting device 10. In addition, it is possible to suppress absorption of light exiting from the substrate 111 by the substrate 2 and the sidewall 3 and deterioration of the substrate 2 and the sidewall 3.

A dotted line in FIG. 1B schematically shows an example of trajectory of light which is totally reflected by the taper and is directed toward the upper side of the light-emitting device 10. The light traveling at such an angle toward an interface between the substrate 111 and the low-refractive-index layer 4 is not totally reflected without the taper and thus cannot be efficiently extracted from the light-emitting device 10.

The taper portions on the side surfaces 111a and 111b of the substrate 111 are formed by dry etching or wet etching using a resist. Alternatively, taper processing by dicing and subsequent removal of damage on a processed portion by dry etching or wet etching may be performed to form the taper. Furthermore, a tapered surface may be processed into a curved surface by controlling etching conditions. It is possible to determine angle and depth of the taper based on a measure of the critical angle which is determined by refractive indices of the substrate 111 and the low-refractive-index layer 4.

A non-tapered portion on the side surface 111a along the longitudinal direction of the substrate 111 has a higher smoothness than the side surface 111b along the lateral direction of the substrate 111. For example, when the substrate 111 is a GaN substrate having a c-plane as a principal surface, the non-tapered portion on the side surface 111a along the longitudinal direction has an m-plane and the non-tapered portion on the side surface 111b along the lateral direction has an a-plane. On a surface with a high smoothness, light is less likely to be scattered and can be efficiently reflected. Thus, the smoothness on the side surface 111a along the longitudinal direction having a larger area is set to be higher than that on the side surface 111b along the lateral direction so as to improve the light extraction efficiency of the light-emitting device 10.

In addition, the light-emitting element 11 has an electrode 113 connected to one of the n-type and p-type semiconductor layers of the crystal layer 112 and an electrode 114 connected to another. The electrodes 113 and 114 are connected, respectively via bumps 12 and 13, to electrodes 14 and 15 attached to the case 1 and extending to the outside of the case 1. The bumps 12 and 13 are, e.g., Au stud bump or solder bump. Alternatively, the electrodes 113 and 114 may be connected to the electrodes 14 and 15 by another means such as bonding using fine metal particles or diffusion bonding instead of using the bumps 12 and 13.

The low-refractive-index layer 4 is a layer having a smaller refractive index than the substrate 111 and totally reflects light which travels in the substrate 111 and reaches the interface between the substrate 111 and the low-refractive-index layer 4 at an angle equal to or greater than the critical angle. The low-refractive-index layer 4 is, e.g., a layer formed of a resin having a low refractive index or a layer of air or vacuum. An air or vacuum layer having a low refractive index is particularly preferable. Note that, when the low-refractive-index layer 4 is formed of a resin, it is possible form the low-refractive-index layer 4 by, e.g., potting a liquid resin inside the sidewall 3 after mounting the light-emitting element 11 on the substrate 2. In this case, reflective particles may be contained in the resin. The reflective particle includes titanium oxide, zirconium oxide and zinc oxide, etc.

The sidewall 3 has a function as a reflector for reflecting light emitted from the light-emitting element 11 when the sidewall 3 is formed of a material having a high reflectivity. In case that the light-emitting device 10 is a small device or a thin device such as side view type LED package, a distance between the light-emitting element 11 and the sidewall 3 is small, the sidewall 3 is thin and an angle of an inner wall of the sidewall 3 is close to the right angle. Therefore, light incident on the sidewall 3 is likely to be absorbed or transmitted and the function of the sidewall 3 as a reflector is impaired. Even in such a case, it is possible to efficiently extract light by totally reflecting light at the interface between the substrate 111 and the low-refractive-index layer 4. In other words, the light-emitting device 10 can maintain high light extraction efficiency even when downsized or thinned.

The phosphor layer 5 is a layer formed of a thermosetting resin, a thermoplastic resin or glass, etc., containing phosphors. When an air or vacuum layer is used as the low-refractive-index layer 4, it is preferable to use glass as a material of the phosphor layer 5 in order to seal the package. When glass is used as a material of the phosphor layer 5, a material excellent in heat resistance such as ceramics which can withstand a bonding temperature of glass is used as a material of the sidewall 3.

The phosphor contained in the phosphor layer 5 absorbs energy of light emitted from the light-emitting element 11 and emits fluorescence. A mixed color composed of a color of light emitted from the light-emitting element 11 and exiting to the outside after transmitting through the phosphor layer 5 and a color of fluorescence emitted from the phosphor is an emission color of the light-emitting device 10. When, for example, an emission color of the light-emitting element 11 is blue and an emission color of the phosphor is yellow, an emission color of the light-emitting device 10 is white. Note that, when a coating layer containing phosphors is formed on an upper surface of the substrate 111 by screen printing, spin coating or spray coating, etc., a layer formed of a resin or glass not containing phosphors may be used instead of the phosphor layer 5.

Since the side surfaces 111a and 111b of the substrate 111 have the tapers, distribution uniformity of light incident on the phosphor layer 5 is improved and angular dependence of chromaticity of the light-emitting device 10 is reduced.

Figure 2A:
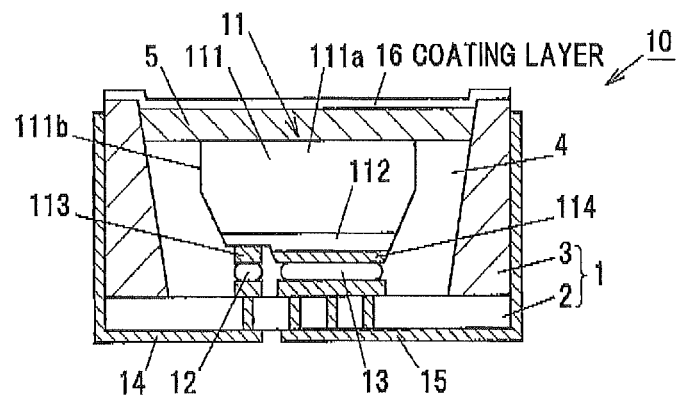
FIGS. 2A and 2B are vertical cross-sectional views showing modifications of the light-emitting device in the first embodiment.
Figure 2B:
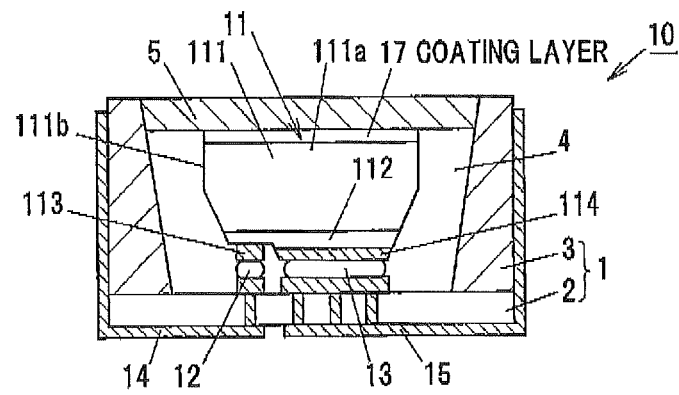

FIGS. 2A and 2B are vertical cross-sectional views showing modifications of the light-emitting device 10. The light-emitting device 10 shown in FIG. 2A has a coating layer 16 on the phosphor layer 5 and the light-emitting device 10 shown in FIG. 2B has a coating layer 17 between the substrate 111 of the light-emitting element 11 and the phosphor layer 5.

The coating layer 16 is formed of a material having a lower refractive index than the phosphor layer 5 and has a thickness of about ¼ of the wavelength. When the phosphor layer 5 is formed of, e.g., a resin containing phosphors and having a refractive index of 1.4, a material having a refractive index of less than 1.4 is used for the coating layer 16. In addition, the coating layer 16 may be a multi-layer film. The coating layer 16 functions as an antireflection layer for preventing light traveling in the phosphor layer 5 from being reflected at an interface between the phosphor layer 5 and the outside air, and can improve light extraction efficiency of the light-emitting device 10.

The coating layer 17 is formed of a material having a refractive index higher than the phosphor layer 5 and lower than the substrate 111. When the phosphor layer 5 is formed of, e.g., a resin containing phosphors and having a refractive index of 1.4 and the refractive index of the substrate 111 is 2.4, a material having a refractive index of not less than 1.4 and not more than 2.4 is used for the coating layer 17. It is preferable that the phosphor layer 5 have, on one hand, a low refractive index in view of light extraction from the light-emitting device 10 to the outside but, on the other hand, have a high refractive index close to that of the substrate 111 or phosphor in view of light extraction from the substrate 111 of the light-emitting element 11 to the phosphor layer 5. Therefore, it is possible to improve light extraction efficiency from the substrate 111 to the phosphor layer 5 by providing the coating layer 17 having a high refractive index and also to improve light extraction efficiency from the light-emitting device 10 to the outside by lowering the refractive index of the phosphor layer 5. The coating layer 17 may be formed by spread coating after mounting the light-emitting element 11 on the substrate 2 but is preferably formed before the mounting.

In addition, by forming the coating layer 17 between the substrate 111 and the phosphor layer 5, it is possible to suppress heat transfer from the light-emitting element 11 to the phosphor layer 5 and to reduce a decrease in luminous efficiency of phosphor caused by the heat.

The light-emitting device 10 may be covered with a lens formed of a resin or glass.

Second Embodiment

The second embodiment is different from the first embodiment in the structure of the light-emitting element. Explanations of the same features as those in the first embodiment will be omitted or simplified.

Figure 3A:
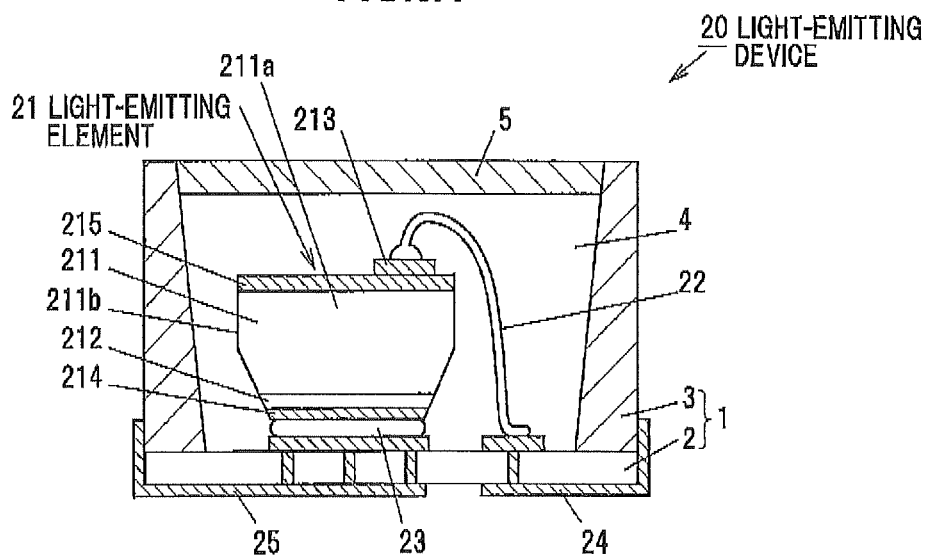
FIGS. 3A and 3B are vertical cross-sectional views showing light-emitting devices in a second embodiment.

FIG. 3A is a vertical cross-sectional view showing a light-emitting device in the second embodiment. A light-emitting device 20 has the case 1 composed of the substrate 2 and the sidewall 3, a light-emitting element 21 mounted on the substrate 2 in a region surrounded by the sidewall 3, the low-refractive-index layer 4 located between the light-emitting element 21 and the sidewall 3 and the phosphor layer 5 located above the light-emitting element 21.

The light-emitting element 21 is a face-down LED chip being rectangular in plan as viewed in a direction perpendicular to the substrate 2 and has a substrate 211 and a crystal layer 212. The substrate 211 is, e.g., a GaN substrate. The crystal layer 212 is a GaN-based semiconductor layer formed on the substrate 211 by epitaxial crystal growth and has a light-emitting layer sandwiched between an n-type semiconductor layer and a p-type semiconductor layer.

A side surface 211a along the longitudinal direction of the substrate 211 is provided with a tapered portion on the side of the substrate 2. In addition, a side surface 211b along the lateral direction of the substrate 211 may be provided with a tapered portion on the side of the substrate 2. Thereby, light emitted from the light-emitting layer of the element 21 is likely to be reflected upward since an angle defined between the light traveling in the substrate 211 toward the outside and a surface of the tapered portion of the substrate 211 decreases so as to improve the light extraction efficiency of the light-emitting device 20. In addition, it is possible to suppress absorption of light exiting from the substrate 211 by the substrate 2 and the sidewall 3 and deterioration of the substrate 2 and the sidewall 3.

A non-tapered portion on the side surface 211a along the longitudinal direction of the substrate 211 has a higher smoothness than the side surface 211b along the lateral direction of the substrate 211. For example, when the substrate 211 is a GaN substrate having a c-plane as a principal surface, the non-tapered portion on the side surface 211a along the longitudinal direction has an m-plane and a non-tapered portion on the side surface 211b along the lateral direction has an a-plane.

In addition, the light-emitting element 21 has a transparent electrode 215 formed on the substrate 211, an electrode 213 connected to the transparent electrode 215 and an electrode 214 connected to the crystal layer 212. The electrodes 213 and 214 are connected, respectively via a wire 22 and a bump 23, to electrodes 24 and 25 attached to the case 1 and extending to the outside of the case 1.

The low-refractive-index layer 4 is a layer having a smaller refractive index than the substrate 211 and totally reflects light which travels in the substrate 211 and reaches an interface between the substrate 211 and the low-refractive-index layer 4 at an angle equal to or greater than the critical angle. Note that, when the low-refractive-index layer 4 is formed of a resin, etc., reflective particles may be contained therein.

Figure 3B:
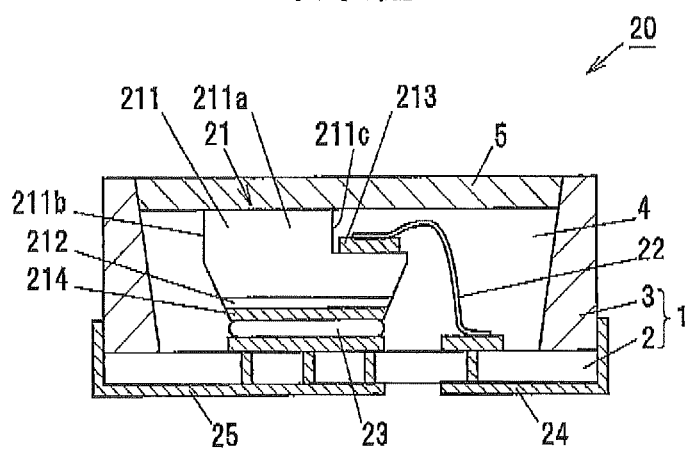

Alternatively, the electrode 213 may be formed in a recessed portion 211c which is provided on a portion of an upper surface of the substrate 211 (a surface on the upper side in FIGS. 3A and 3B) by etching, as shown in FIG. 3B. In this case, for example, the electrode 213 of the light-emitting element 21 is wedge-bonded to the electrode 24 attached to the case 1. Since a height of the wire 22 can be smaller in wedge bonding than in ball bonding, etc., it is possible to form the wire 22 at a position lower than the upper surface of the light-emitting element 21. Accordingly, even when the phosphor layer 5 is arranged so as to be in contact with the upper surface of the substrate 211 without providing the transparent electrode 215, the phosphor layer 5 does not interfere with the wire 22. By arranging the phosphor layer 5 so as to be in contact with the upper surface of the substrate 211, it is possible to prevent a decrease in light extraction efficiency caused by an interposition of another layer such as an air layer between the phosphor layer 5 and the substrate 211.

Third Embodiment

The third embodiment is different from the first embodiment in the structure of the light-emitting element. Explanations of the same features as those in the first embodiment will be omitted or simplified.

Figure 4:
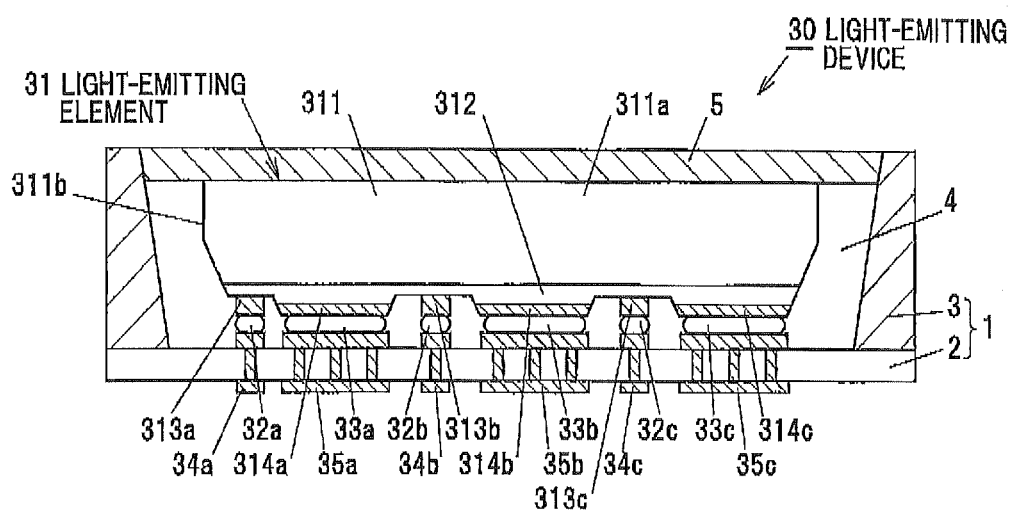
FIG. 4 is a vertical cross-sectional view showing a light-emitting device in a third embodiment.

FIG. 4 is a vertical cross-sectional view showing a light-emitting device in the third embodiment. A light-emitting device 30 has the case 1 composed of the substrate 2 and the sidewall 3, a light-emitting element 31 mounted on the substrate 2 in a region surrounded by the sidewall 3, the low-refractive-index layer 4 located between the light-emitting element 31 and the sidewall 3 and the phosphor layer 5 on the light-emitting element 31.

The light-emitting element 31 is a face-down LED chip being rectangular in plan as viewed in a direction perpendicular to the substrate 2 and has a substrate 311 and a crystal layer 312. The substrate 311 is, e.g., a GaN substrate. The crystal layer 312 is a GaN-based semiconductor layer formed on the substrate 311 by epitaxial crystal growth and has a light-emitting layer sandwiched between an n-type semiconductor layer and a p-type semiconductor layer. The light-emitting element 31 is formed by coupling three light-emitting elements 11 of the first embodiment along the longitudinal direction. It is possible to use the light-emitting device 30 as a linear light source which gives small granular feeling of line light.

A side surface 311a along the longitudinal direction of the substrate 311 is provided with a tapered portion on the side of the substrate 2. Also, a side surface 311b along the lateral direction of the substrate 311 may be provided with a tapered portion on the side of the substrate 2. Thereby, light emitted from the light-emitting layer is likely to be reflected upward since an angle defined between the light traveling in the substrate 311 toward the outside and a surface of the tapered portion of the substrate 311 decreases so as to improve the light extraction efficiency of the light-emitting device 30. In addition, it is possible to suppress absorption of light exiting from the substrate 311 by the substrate 2 and the sidewall 3 and deterioration of the substrate 2 and the sidewall 3.

A non-tapered portion on the side surface 311a along the longitudinal direction of the substrate 311 has a higher smoothness than the side surface 311b along the lateral direction of the substrate 311. For example, when the substrate 311 is a GaN substrate having a c-plane as a principal surface, the non-tapered portion on the side surface 311a along the longitudinal direction has an m-plane and the non-tapered portion on the side surface 311b along the lateral direction has an a-plane.

In addition, the light-emitting element 31 has electrodes 313a, 313b and 313c connected to one of the n-type and p-type semiconductor layers of the crystal layer 312 and electrodes 314a, 314b and 314c connected to another. The electrodes 313a, 313b, 313c, 314a, 314b and 314e are connected, respectively via bumps 32a, 32b, 32c, 33a, 33b and 33c, to electrodes 34a, 34b, 34c, 35a, 35b and 35c attached to the case 1 and extending to the outside of the case 1.

The low-refractive-index layer 4 is a layer having a smaller refractive index than the substrate 311 and totally reflects light which travels in the substrate 311 and reaches an interface between the substrate 311 and the low-refractive-index layer 4 at an angle equal to or greater than the critical angle.

Fourth Embodiment

The fourth embodiment is different from the first embodiment in the structure of the light-emitting element. Explanations of the same features as those in the first embodiment will be omitted or simplified.

Figure 5A:
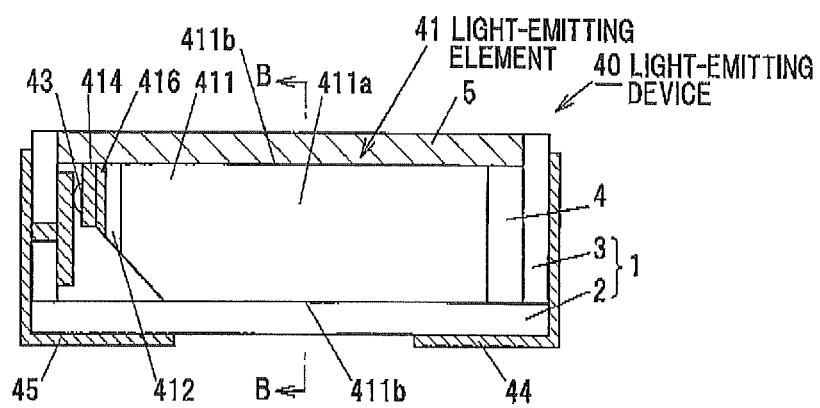
FIGS. 5A and 5B are respectively a vertical cross-sectional view and a top view showing a light-emitting device in a fourth embodiment and FIG. 5C is a cross sectional view of the light-emitting device taken on line B-B of FIG. 5A.
Figure 5B:
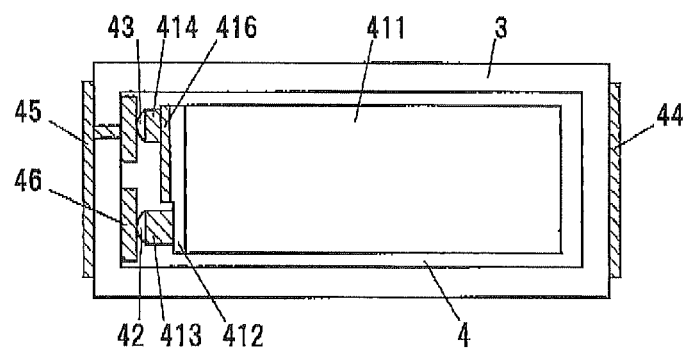
Figure 5C:
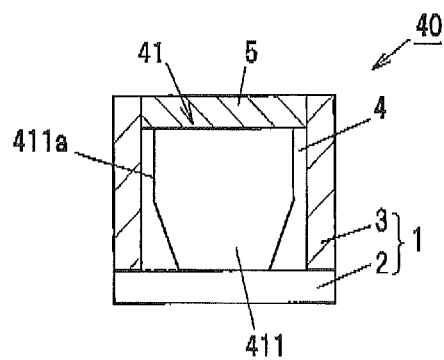

FIGS. 5A and 5B are respectively a vertical cross-sectional view and a top view showing a light-emitting device in the fourth embodiment. FIG. 5C is a cross sectional view of the light-emitting device taken on line B-B of FIG. 5A. Note that, an illustration of the phosphor layer 5 is omitted in FIG. 5B.

A light-emitting device 40 has the case 1 composed of the substrate 2 and the sidewall 3, a light-emitting element 41 mounted on the substrate 2 in a region surrounded by the sidewall 3, the low-refractive-index layer 4 located between the light-emitting element 41 and the sidewall 3 and the phosphor layer 5 on the light-emitting element 41.

The light-emitting element 41 has a substrate 411 and a crystal layer 412 and is arranged so that a surface direction of the crystal layer 412 is substantially perpendicular to that of the substrate 2, i.e., at an angle 90° different from that in the light-emitting device 10 of the first embodiment. The substrate 411 is, e.g., a GaN substrate. The crystal layer 412 is a GaN-based semiconductor layer formed on the substrate 411 by epitaxial crystal growth and has a light-emitting layer sandwiched between an n-type semiconductor layer and a p-type semiconductor layer.

A side surface 411a along the longitudinal direction of the substrate 411 is provided with a tapered portion on the side of the substrate 2. Also, a side surface 411b along the lateral direction of the substrate 411 may be provided with a tapered portion on the side of the substrate 2. Thereby, light emitted from the light-emitting layer is likely to be reflected upward since an angle defined between the light traveling in the substrate 411 toward the outside and a surface of the tapered portion of the substrate 411 decreases so as to improve the light extraction efficiency of the light-emitting device 40. In addition, it is possible to suppress absorption of light exiting from the substrate 411 by the substrate 2 and the sidewall 3 and deterioration of the substrate 2 and the sidewall 3.

A non-tapered portion on the side surface 411a along the longitudinal direction of the substrate 411 has a higher smoothness than the side surface 411b along the lateral direction of the substrate 411. For example, when the substrate 411 is a GaN substrate having a c-plane as a principal surface, the non-tapered portion on the side surface 411a along the longitudinal direction has an m-plane and a non-tapered portion on the side surface 411b along the lateral direction has an a-plane.

Since a bottom surface of the light-emitting element 41 (a surface parallel to the substrate 2) is an a-plane in which light is less likely to be scattered when the side surface 411b is an a-plane, light extraction efficiency of the light-emitting element 41 is improved. In addition, it is possible to control the smoothness of the a-plane by adjusting scribing conditions, etc.

In addition, the light-emitting element 41 has an electrode 413 connected to one of the n-type and p-type semiconductor layers of the crystal layer 412 and an electrode 414 connected to another via an electrode 416. The electrodes 413 and 414 are connected, respectively via bumps 42 and 43, to electrodes 46 and 45 attached to the case 1. The electrode 45 extends from the inside to the outside of the case 1 and the electrode 46 is located inside of the case 1 and is electrically connected to an electrode 44 located on the outside of the case 1.

The low-refractive-index layer 4 is a layer having a smaller refractive index than the substrate 411 and totally reflects light which travels in the substrate 411 and reaches an interface between the substrate 411 and the low-refractive-index layer 4 at an angle equal to or greater than the critical angle.

Fifth Embodiment

The fifth embodiment is different from the first embodiment in the structure of the light-emitting element. Explanations of the same features as those in the first embodiment will be omitted or simplified.

Figure 6A:
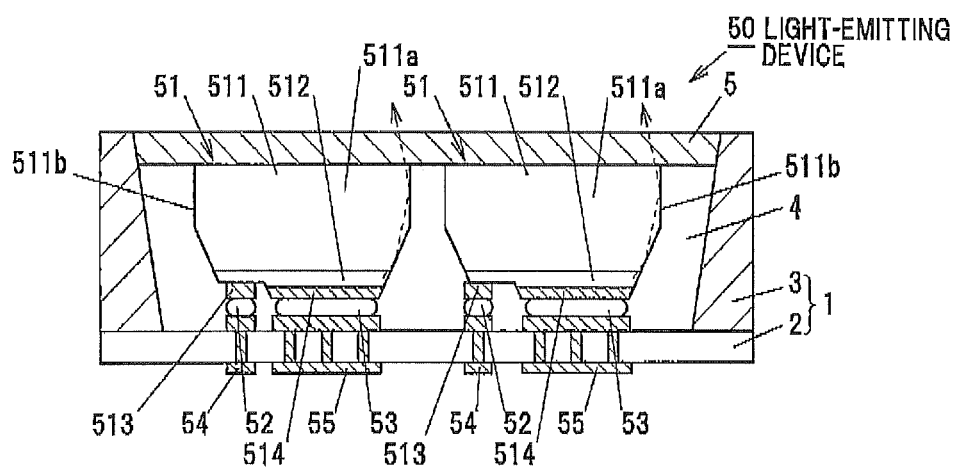
FIGS. 6A and 6B are vertical cross-sectional views showing light-emitting devices in a fifth embodiment.

FIG. 6A is a vertical cross-sectional view showing a light-emitting device in the fifth embodiment. A light-emitting device 50 has the case 1 composed of the substrate 2 and the sidewall 3, two light-emitting elements 51 mounted on the substrate 2 in a region surrounded by the sidewall 3, the low-refractive-index layer 4 located between each light-emitting element 51 and the sidewall 3 and between the two light-emitting elements, and the phosphor layer 5 on the light-emitting elements 51.

The light-emitting element 51 is a face-down LED chip being rectangular in plan as viewed in a direction perpendicular to the substrate 2 and has a substrate 511 and a crystal layer 512. The substrate 511 is, e.g., a GaN substrate. The crystal layer 512 is a GaN-based semiconductor layer formed on the substrate 511 by epitaxial crystal growth and has a light-emitting layer sandwiched between an n-type semiconductor layer and a p-type semiconductor layer. The light-emitting element 51 has the same structure as the light-emitting element 11 in the first embodiment.

A side surface 511a along the longitudinal direction of the substrate 511 is provided with a tapered portion on the side of the substrate 2. Also, a side surface 511b along the lateral direction of the substrate 511 may be provided with a tapered portion on the side of the substrate 2. Thereby, light emitted from the light-emitting layer is likely to be reflected upward since an angle defined between the light traveling in the substrate 511 toward the outside and a surface of the tapered portion of the substrate 511 decreases so as to improve the light extraction efficiency of the light-emitting device 50. In addition, it is possible to suppress absorption of light exiting from the substrate 511 by the substrate 2 and the sidewall 3 and deterioration of the substrate 2 and the sidewall 3.

A non-tapered portion on the side surface 511a along the longitudinal direction of the substrate 511 has a higher smoothness than the side surface 511b along the lateral direction of the substrate 511. For example, when the substrate 511 is a GaN substrate having a c-plane as a principal surface, the non-tapered portion on the side surface 511a along the longitudinal direction has an m-plane and a non-tapered portion of the side surface 511b along the lateral direction has an a-plane.

In addition, the light-emitting element 51 has an electrode 513 connected to one of the n-type and p-type semiconductor layers of the crystal layer 512 and an electrode 514 connected to another. The electrodes 513 and 514 are connected, respectively via bumps 52 and 53, to electrodes 54 and 55 attached to the case 1 and extending to the outside of the case 1.

The low-refractive-index layer 4 is a layer having a smaller refractive index than the substrate 511 and totally reflects light which travels in the substrate 511 and reaches the interface between the substrate 511 and the low-refractive-index layer 4 at an angle equal to or greater than the critical angle.

Figure 6B:
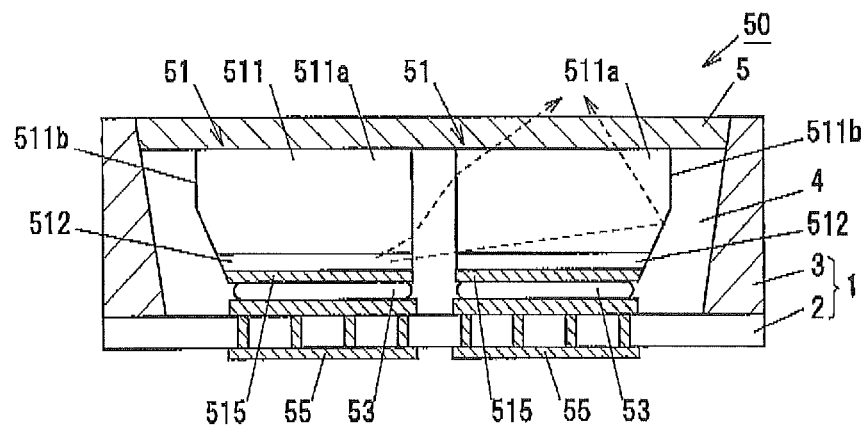

FIG. 6B is a vertical cross-sectional view showing a modification of the light-emitting device 50. In the light-emitting device 50 shown in FIG. 6B, the inner side surfaces 511b, which face each other and are adjacent to each other, of the two light-emitting elements 51 are not provided with any tapered portion. Therefore, for example, light emitted from one of the light-emitting elements 51 and inputted to the substrate 511 of another light-emitting element 51 can be totally reflected by the tapered portion on the outer side surface 511b of the substrate 511 of the other light-emitting element 51.

Dotted lines in FIGS. 6A and 6B schematically show examples of trajectory of light in the respective light-emitting devices 50. Note that, a cross section not including the electrode 513 is shown in FIG. 6B in order to facilitate the illustration of the trajectory of light.

Effects of the Embodiments

In the embodiments, it is possible to increase light extraction efficiency of the light-emitting devices 10, 20, 30, 40 and 50 by providing the low-refractive-index layer 4 between the light-emitting element 11, 21, 31, 41 or 51 and the sidewall 3, providing at least the taper portion on the side surface 111a, 211a, 311a, 411a or 511a along the longitudinal direction of the substrate 111, 211, 311, 411 or 511 on the substrate 2 side and using as the side surface 111a, 211a, 311a, 411a or 511a along the longitudinal direction a surface having a higher smoothness than the side surface 111b, 211b, 311b, 411b or 511b along the lateral direction etc. Furthermore, the light-emitting devices 10, 20, 30, 40 and 50 can ensure high light extraction efficiency even when it is downsized or thinned.

The present invention is not intended to be limited to the above-mentioned embodiments, and the various kinds of modifications can be implemented without departing from the gist of the invention. For example, a light extraction surface of the light-emitting element directly or indirectly in contact with the phosphor layer is flat in the embodiments but may be roughened by wet etching. Light extraction efficiency is improved by roughening. At that time, a region of the phosphor layer in close contact with the light extraction surface of the light-emitting element may be formed into a rough surface similar to the light extraction surface of the light-emitting element by bringing the phosphor layer directly into contact with the light-emitting element, or a surface of the phosphor layer on the light-emitting element side may remain flat by arranging the phosphor layer so as to be indirectly in contact with the light-emitting element via the coating layer.

In addition, the constituent elements in the embodiments can be arbitrarily combined without departing from the gist of the invention.

In addition, the invention according to claims is not to be limited to the above-mentioned embodiments. Further, please note that all combinations of the features described in the embodiments are not necessary to solve the problem of the invention.

What is claimed is:

1. A light-emitting device, comprising:
   a case comprising a first substrate and a sidewall on the first substrate;
   a light-emitting element that is mounted on the first substrate in a region surrounded by the sidewall and the light-emitting element comprises a second substrate and a crystal layer, the light-emitting element being formed rectangularly with two adjacent sides different in length in a plane viewed in a direction perpendicular to the first substrate; and
   a low-refractive-index layer that is located between the light-emitting element and the sidewall and has a smaller refractive index than the second substrate,
   wherein a side surface along a longitudinal direction of the second substrate is provided with a tapered portion on a side of the first substrate,
   wherein a side surface along a lateral direction of the second substrate is provided with a tapered portion on the side of the first substrate, and
   wherein a non-tapered portion on the side surface along the longitudinal direction of the second substrate has a higher smoothness than a non-tapered portion on the side surface along a lateral direction of the second substrate.

2. The light-emitting device according to claim 1, wherein the second substrate comprises a GaN substrate having a c-plane as a principal surface,
   wherein the non-tapered portion on the side surface along the longitudinal direction of the second substrate comprises an m-plane, and
   wherein the side surface along the lateral direction of the second substrate comprises an m-plane.

3. The light-emitting device according to claim 1, wherein the low-refractive-index layer comprises a layer of air or vacuum.

4. The light-emitting device according to claim 3, wherein the case is sealed by a glass layer formed on the sidewall.

5. The light-emitting device according to claim 1, further comprising a plurality of light-emitting elements, and
wherein the low-refractive-index layer is located between each of the plurality of light-emitting elements and the sidewall and between the plurality of light-emitting elements.

6. The light-emitting device according to claim 1, wherein the side surface along the longitudinal direction of the second substrate includes a longitudinal portion adjacent to the tapered portion.

7. The light-emitting device according to claim 6, wherein the tapered portion of the side surface along the longitudinal direction of the second substrate and at least a portion of the longitudinal portion are both disposed longitudinally above the light-emitting element.

8. The light-emitting device according to claim 1, wherein the low-refractive-index layer comprises a vacuum.

9. A light-emitting device, comprising:
a case comprising a first substrate and a sidewall on the first substrate;
a light-emitting element that is mounted on the first substrate in a region surrounded by the sidewall, the light-emitting element comprises a second substrate and a crystal layer, the light-emitting element being formed rectangularly in a plane viewed in a direction perpendicular to the first substrate; and
a low-refractive-index layer that is located between the light-emitting element and the sidewall and has a smaller refractive index than the second substrate,
wherein the second substrate comprises:
a side surface along a longitudinal direction of the second substrate, the side surface along the longitudinal direction includes a non-tapered portion and a tapered portion; and
a side surface along a lateral direction of the second substrate, the side surface along the lateral direction includes a non-tapered portion and a tapered portion,
wherein the tapered portion of the side surface along the longitudinal direction is provided nearer to the first substrate than the non-tapered portion,
wherein the tapered portion of the side surface along the lateral direction is provided nearer to the first substrate than the non-tapered portion, and
wherein the non-tapered portion on the side surface along the longitudinal direction of the second substrate has a higher smoothness than a non-tapered portion on the side surface along the lateral direction of the second substrate.

10. The light-emitting device according to claim 9, wherein the rectangularly formed light-emitting element has two adjacent sides different in length.

* * * * *